United States Patent
Sachdev et al.

(10) Patent No.: US 7,613,067 B2
(45) Date of Patent: Nov. 3, 2009

(54) SOFT ERROR ROBUST STATIC RANDOM ACCESS MEMORY CELLS

(76) Inventors: Manoj Sachdev, 55 Leighland Drive, Waterloo, Ontario (CA) N2T 2K2; Shah M Jahinuzzaman, 9 Amos Avenue, Apt. 8, Waterloo, Ontario (CA) N2L 2W6

(*) Notice: Subject to any disclaimer, the term of this patent is extended or adjusted under 35 U.S.C. 154(b) by 127 days.

(21) Appl. No.: 11/876,223

(22) Filed: Oct. 22, 2007

(65) Prior Publication Data

US 2008/0094925 A1    Apr. 24, 2008

Related U.S. Application Data

(60) Provisional application No. 60/853,034, filed on Oct. 20, 2006.

(51) Int. Cl.
G11C 8/00    (2006.01)
(52) U.S. Cl. .................. 365/230.06; 365/154; 365/200; 365/230.08
(58) Field of Classification Search ................. 365/154, 365/158, 230.06, 230.08, 200
See application file for complete search history.

(56) References Cited

U.S. PATENT DOCUMENTS

| 2006/0125547 A1* | 6/2006 | Maymandi-Nejad et al. ................ 327/512 |
| 2006/0187724 A1* | 8/2006 | Pineda De Gyvez et al. 365/201 |
| 2007/0177419 A1* | 8/2007 | Sachdev et al. ............ 365/156 |
| 2008/0019162 A1* | 1/2008 | Ogura et al. .................. 365/72 |

* cited by examiner

*Primary Examiner*—Tuan T Nguyen
*Assistant Examiner*—Hien N Nguyen
(74) *Attorney, Agent, or Firm*—Gowling Lafleur Henderson LLP

(57) ABSTRACT

A Static Random Access Memory (SRAM) cell is provided with an improved robustness to radiation induced soft errors. The SRAM cell includes the following elements. First and second storage nodes are configured to store complementary voltages. Access transistors are configured to selectively couple the first and second storage nodes to a corresponding bit line. Drive transistors are configured to selectively couple one of the first and second storage nodes to ground. Load transistors are configured to selectively couple the other one of the first and second storage nodes to a power supply. At least one stabilizer transistor is configured to provide a corresponding redundant storage node and limit feedback between the first and second storage nodes. The redundant storage node is capable of restoring the first or second storage nodes in case of a soft error.

8 Claims, 4 Drawing Sheets

SOFT ERROR ROBUST STATIC RANDOM ACCESS MEMORY CELLS

The present invention relates generally to Static Random Access Memory (SRAM) cells and specifically to SRAM cells that limit the effect of radiation induced soft errors. The present application claims priority from U.S. Provisional Application No. 60/853,034, filed Oct. 20, 2006.

BACKGROUND

SRAM cells are one of the most popular ways to store data in electronic systems. Further, embedded SRAM cells are a vital building block in integrated circuits. SRAM cells are typically preferred because of higher speed, robust design, and ease of integration. However, SRAM cells, in general, occupy a significantly large portion of a chip's die area, making it an important block in terms of yield, reliability and power consumption. With increasing demand for highly integrated System on Chip (SoC) design, improving various aspects of embedded SRAM cells has received significant interest.

Specifically, nano-metric semiconductor technologies are becoming highly sensitive to transients induced by ionizing radiation consisting of energetic cosmic neutrons and alpha particles. These particles generate a large number of electron hole pairs, which may be collected by sensitive nodes resulting in data upset, also known as soft errors (SE). Accordingly, a number of solutions have been proposed to improve the robustness of the SRAM cell.

For example, referring to FIG. 2, a schematic diagram of an SRAM cell having improved robustness to radiation induced soft errors is shown. In the proposed solution, the SRAM includes a coupling capacitor. The coupling capacitor significantly increases the critical charge (Qc), which is the minimum charge required to cause an soft error. However, adding a large, area efficient coupling capacitor requires a special semiconductor manufacturing process. Therefore the proposed SRAM cell is not easily integrated with common Complementary metal-oxide-semiconductor (CMOS) digital circuits. As a consequence, for Application Specific Integrated Circuits (ASICs) where embedded SRAM cells are widely realized using standard CMOS process, it is rather difficult to implement.

Referring to FIG. 3, a schematic diagram of an alternate SRAM cell having improved robustness to soft errors is shown. In the proposed solution, a soft error robust data latch is implemented. The latch is immune to single node upsets. However, implementing the solution as an SRAM cell with differential ports requires additional transistors making it expensive.

Technology scaling is making SRAM cells susceptible to radiation induced soft errors. Therefore, building a soft error robust SRAM cell is becoming a high priority. Further, it is desirable to improve the cell immunity against soft errors while limiting the number of extra transistors. Reducing the number of transistors allows the SRAM cell to occupy less space, which permits higher cell density.

SUMMARY OF THE INVENTION

In accordance with an aspect of the present invention there is provided a Static Random Access Memory (SRAM) cell comprising: first and second storage nodes configured to store complementary voltages; access transistors configured to selectively couple the first and second storage nodes to a corresponding bit line; drive transistors configured to selectively couple one of the first and second storage nodes to ground; load transistors configured to selectively couple the other one of the first and second storage nodes to a power supply; and at least one stabilizer transistor configured to provide a corresponding redundant storage node and limit feedback between the first and second storage nodes, the redundant storage node being capable of restoring the first or second storage nodes in case of a soft error.

BRIEF DESCRIPTION OF THE DRAWINGS

Embodiments of the present invention will now be described by way of example only with reference to the following drawings in which.

DETAILED DESCRIPTION OF THE PREFERRED EMBODIMENTS

Figure 1:
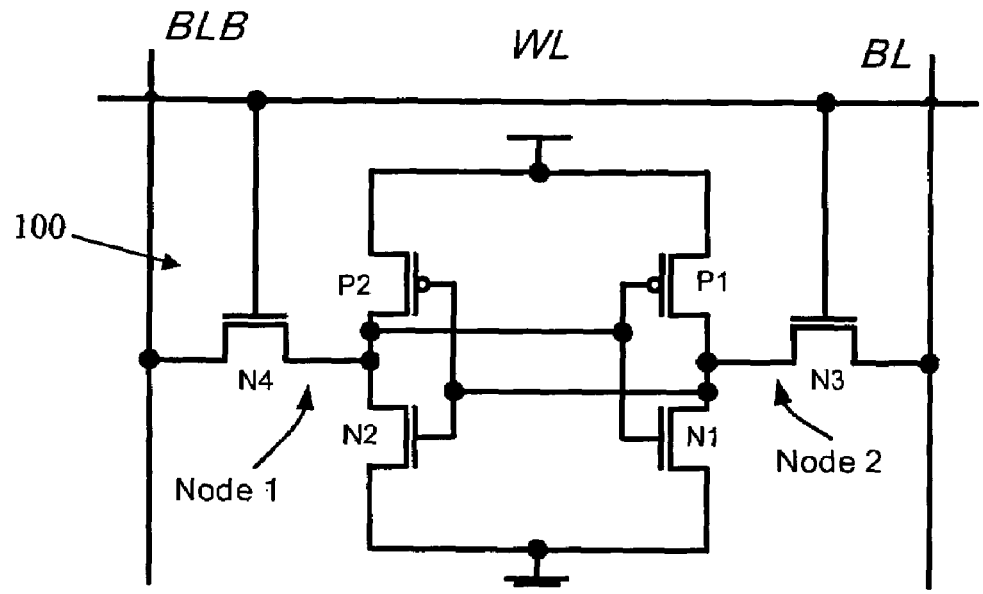
FIG. 1 is a schematic drawing of a standard SRAM cell (prior art)
Figure 2:
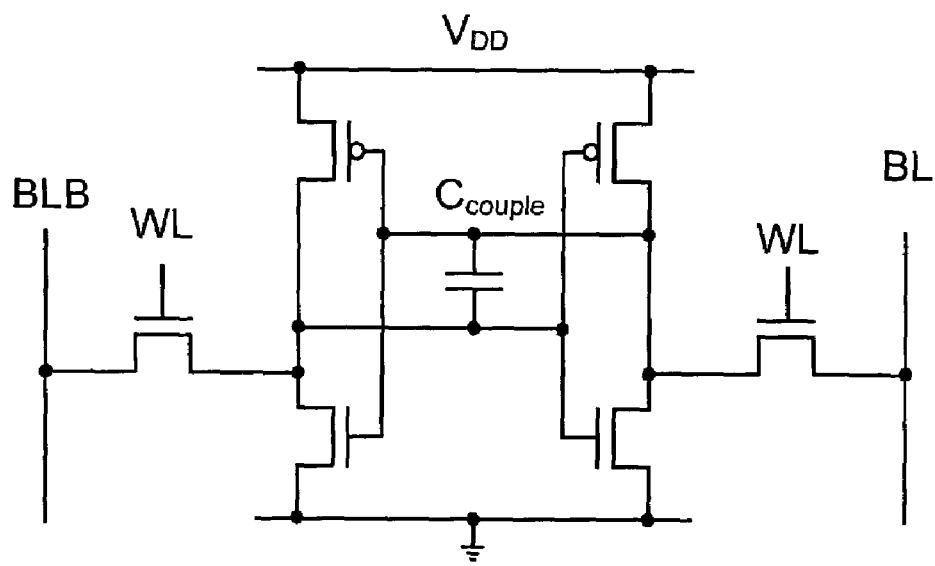
FIG. 2 is a schematic drawing of a proposed SRAM having improved robustness to radiation induced soft errors (prior art)
Figure 3:
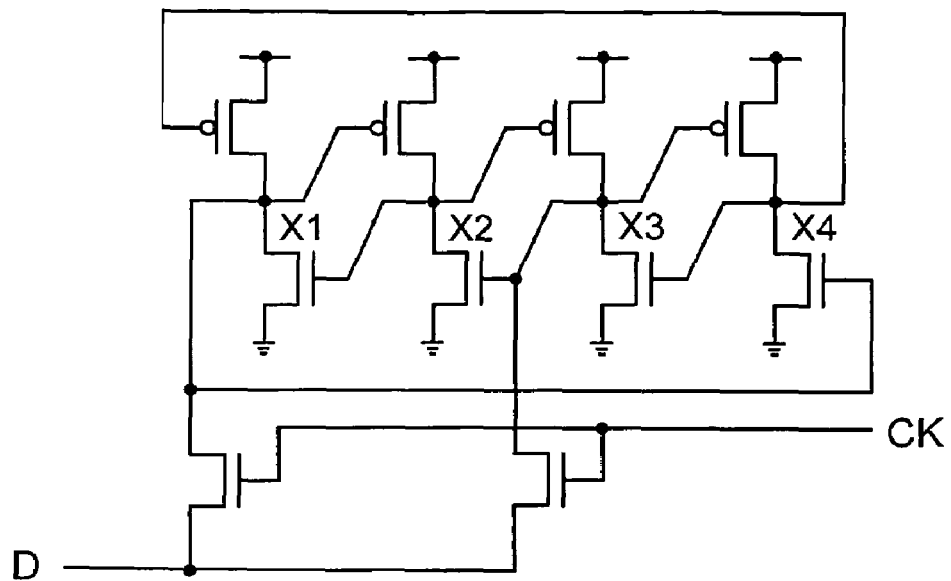
FIG. 3 is a schematic drawing of an alternate proposed SRAM having improved robustness to radiation induced soft errors (prior art)

For convenience, like numerals in the description refer to like structures in the drawings. Referring to FIG. 1, a standard six-transistor SRAM cell is illustrated generally by numeral 100. The SRAM cell 100 comprises a pair of n-type drive transistors N1 and N2 and a pair of p-type load transistors P1 and P2 in a cross-coupled configuration. A further pair of n-type access transistors N3 and N4 couples the cell 100 to a complementary bit-line pair BL and BLB. The sources of the drive transistors N1 and N2 are coupled to ground, and the sources of the load transistors P1 and P2 are coupled to a supply voltage $V_{DD}$.

The SRAM cell 100 is coupled to the bit-line pair BL and BLB in a response to a word-line control signal WL from a row decoder (not shown). Accordingly, when the word-line control signal WL is active, the SRAM cell 100 is electrically connected to the bit-line pair BL and BL.

Figure 4:
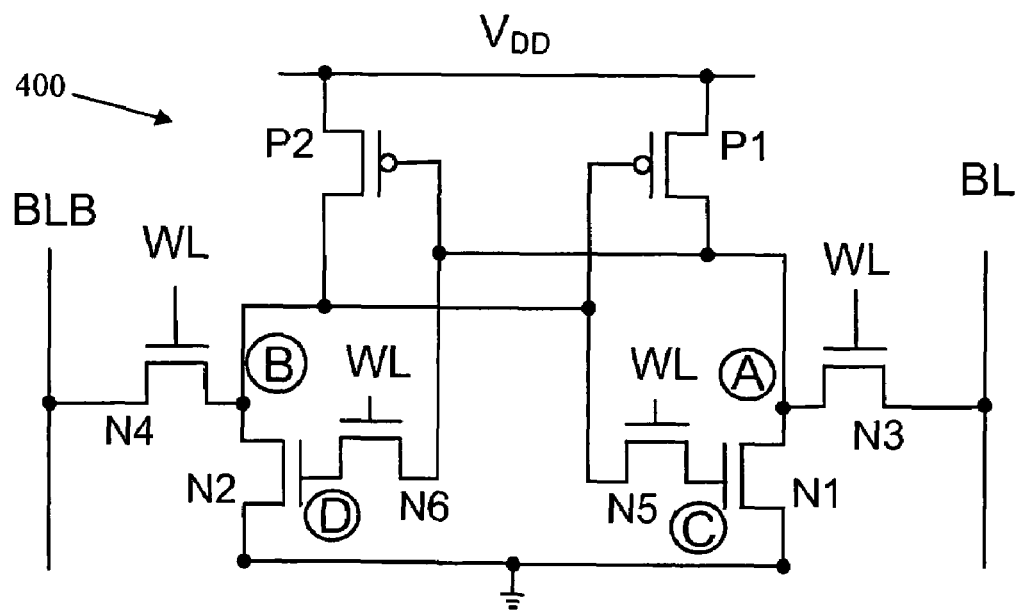
FIG. 4 is a schematic drawing of a soft error robust (SER) SRAM cell in accordance with one embodiment.

Referring to FIG. 4, a soft error robust (SER) SRAM cell in accordance with an embodiment of the invention is illustrated generally by numeral 400. The SER SRAM cell 400 is similar to SRAM cell illustrated in FIG. 1. For ease of description, the node at the junction of the drain of load transistor P1 and the source of drive transistor N1 will be referred to as storage node A. Similarly, the node at the junction of the drain of load transistor P2 and the source of drive transistor N2 will be referred to as storage node B. The nodes A and B are referred to as storage node because they store respective voltages when the access transistors N3 and N4 are turned off, as is known in the art.

However, in the present embodiment, the drive transistors N1 and N2 are designed to be stronger than their corresponding load transistors P1 and P2, respectively. Further, the cell comprises an additional two n-type stabilizer transistors N5 and N6. Stabilizer transistor N5 is coupled between the gate of load transistor P1 and the gate of drive transistor N1. Stabilizer transistor N6 is coupled between the gate of load transistor P2 and the gate of drive transistor N2. The gates of the stabilizer transistors N5 and N6 are connected to the word line WL. For ease of description, the node at the gate of stabilizer transistor N5 will be referred to as storage node C and the node at the gate of stabilizer transistor N6 will be referred to as storage node D. Storage nodes C and D are provide redundant storage.

The SER SRAM cell 400 is able to hold two states when the access transistors N3 and N4 are turned off. The states are associated with a binary one and a binary zero. Accordingly, when the access transistors N3 and N4 are turned off storage nodes A and B store voltages for a corresponding binary number.

From the description above as well as from FIG. 4, it will be appreciated that the stabilizer transistors N5 and N6 break the inherent positive feedback between the storages nodes A and B and provide additional storage nodes C and D. That is, the gates of the stabilizer transistors N5 and N6 are controlled by the word line WL so that the feedback mechanism only works when the word line WL goes high. Further, the stabilizer transistors N5 and N6 are designed to have a very low threshold voltage, and hence a higher leakage. This feature helps achieve almost full swing at the storage nodes C and D. Alternatively, the word line WL may be overdriven to achieve full swing signal at the storage nodes C and D.

It will be appreciated that breaking the inherent feedback of the cross-coupled drive and load transistors N1, N2, P1, and P2, respectively, and providing additional storages nodes improves the robustness of an SRAM cell significantly.

For example, consider the case when storage nodes A and D store a logic 1 while storage nodes B and C store a logic 0. If the voltage at storage node A becomes logic 0 due to a soft error, such as cosmic radiation, the load transistor P2 turns on. However, drive transistor N2 is also on because storage node D stores a logic 1.

Since drive transistor N2 is designed to be stronger than load transistor P2, storage node B will retain its original logic value of 0. This will, in turn, keep load transistor P1 turned on. Since load transistor P1 remains on, it will ensure the storage node A recovers its original logic value of 1. Similarly, a radiation incident on storage node B will not also result in a data upset.

Figure 5:
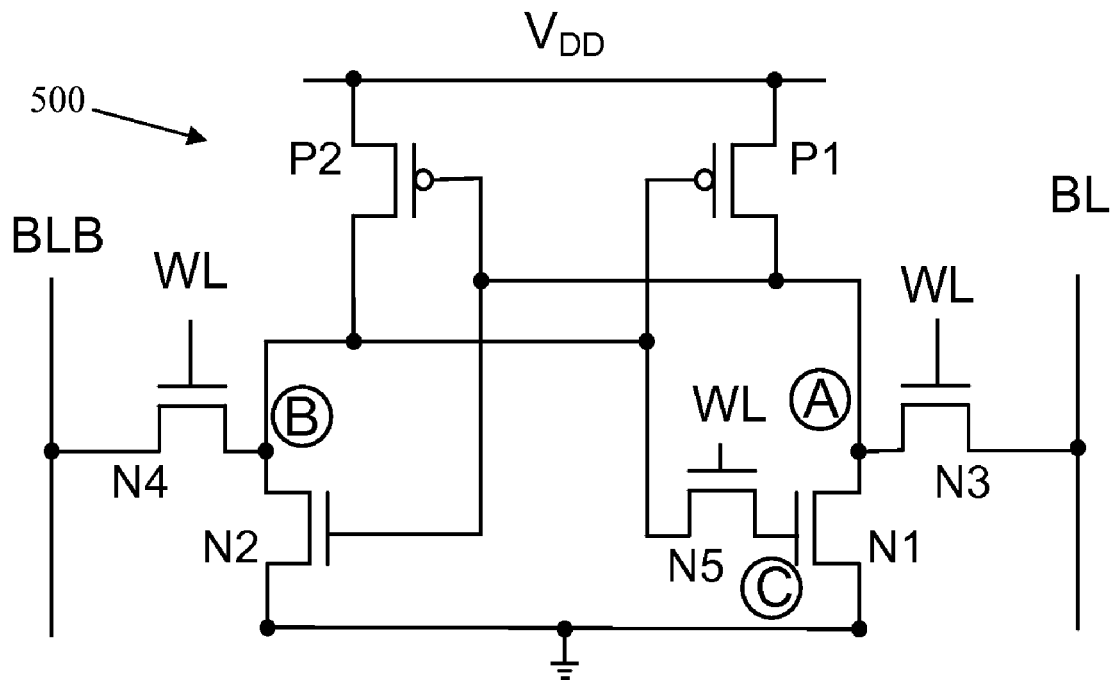
FIG. 5 is a schematic drawing of a SER SRAM cell in accordance with an alternate embodiment.

Referring to FIG. 5, a SER SRAM cell in accordance with an alternate embodiment is illustrated generally by numeral 500. The SER SRAM cell 500 of the present embodiment is similar to the SER SRAM 400 as described with reference to FIG. 4. However, in the present embodiment, the SER SRAM cell 500 includes only one stabilizer transistor N5.

Figure 6:
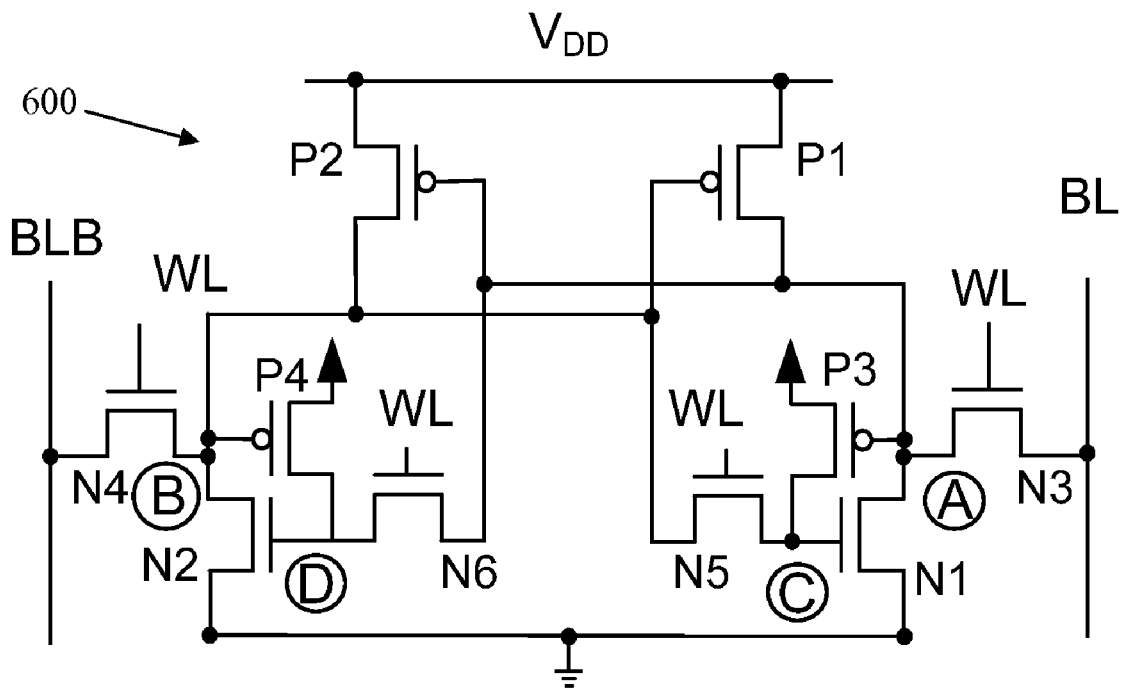
FIG. 6 is a schematic drawing of a SER SRAM cell in accordance with yet an alternate embodiment.

Referring to FIG. 6, a SER SRAM cell in accordance with yet an alternate embodiment is illustrated generally by numeral 600. The SER SRAM cell 600 of the present embodiment is similar to the SER SRAM 400 as described with reference to FIG. 4. However, in the present embodiment, the SER SRAM cell 600 includes supply transistors P3 and P4. As shown, the supply transistor P3 is coupled between the power supply $V_{DD}$ and storage node C, and is gated by the voltage stored on storage node A. Similarly, the supply transistor P4 is coupled between the power supply $V_{DD}$ and storage node D, and is gated by the voltage stored on storage node B.

Although the SER SRAM cell 600 operates in a similar manner to the SER SRAM cell 400 described with reference to FIG. 4, the two supply transistors P3 and P4 are added to provide more stable complementary voltages at storage nodes C and D, respectively.

Figure 7:
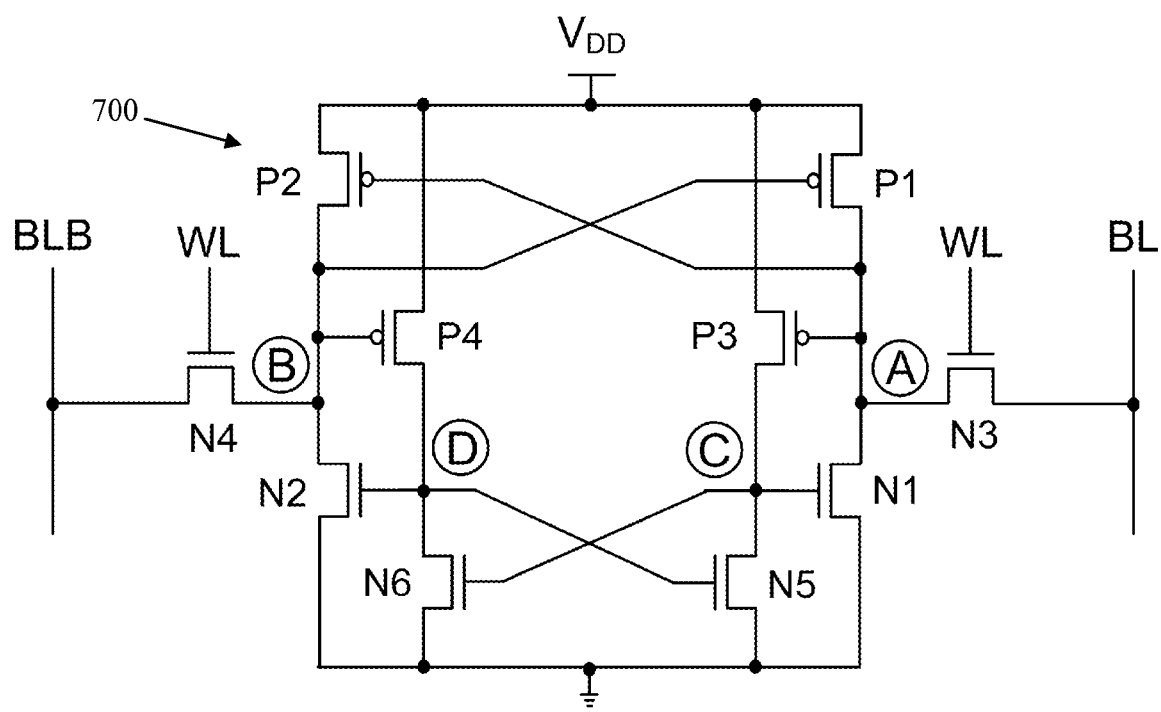
FIG. 7 is a schematic drawing of a SER SRAM cell in accordance with yet an alternate embodiment.

Referring to FIG. 7, a SER SRAM cell in accordance with yet an alternate embodiment is illustrated generally by numeral 700. Load transistors P1 and P2 are coupled at the source to the power supply V DD. The drain of load transistor P1 is coupled to storage node A. The drain of load transistor P2 is coupled to storage node B. Load transistor P2 is gated by storage node A and load transistor P1 is gated by storage node B.

The drain of drive transistor N2 is coupled to storage node B. The drain of drive transistor N1 is coupled to storage node A. Both drive transistors N1 and N2 are coupled at the source to ground. Drive transistor N1 is driven by storage node C and drive transistor N2 is driven by storage node D.

Stabilizer transistor P4 is coupled between the power supply and storage node D, and is driven by storage node B. Stabilizer transistor N6 is coupled between storage node D and ground, and is driven by storage node C.

Stabilizer transistor P3 is coupled between the power supply and storage node C, and is driven by storage node A. Stabilizer transistor N5 is coupled between storage node C and ground, and is driven by storage node D.

Storage nodes A and B are coupled to bit-line pair BL and BLB by access transistors N3 and N4, respectively.

Similar to the previously described embodiments, the gates of the drive transistors N1 and N2 are driven by the storage nodes C and D. However, in the present embodiment, the complementary logic voltages at the internal nodes are held very strongly either at logic 1 or logic 0 by cross-coupled stabilizer transistors P3, P4, N5 and N6. Accordingly, the load transistors P1 and P2 and the drive transistors N1 and N2 are effectively cross coupled via the cross-coupled stabilizer transistors P3, P4, N5 and N6.

Such an arrangement provides two strong redundant storage nodes C and D. Consequently, in the event of a particle strike at one of the nodes A, B, C or D, there are three unaffected nodes that can restore the logic state of the affected node. Thus, the SER SRAM cell greatly reduces the likelihood of a SRAM cell experiencing a soft error.

Accordingly, it will be appreciated by a person of ordinary skill in the art that the present invention provides improved robustness for SRAM cells in the face of soft errors. Further, although the invention has been described with reference to certain specific embodiments, various modifications thereof will be apparent to those skilled in the art without departing from the scope of the invention as defined by the appended claims.

The invention claimed is:

1. A Static Random Access Memory (SRAM) cell comprising:
    first and second storage nodes configured to store complementary voltages;
    access transistors configured to selectively couple the first and second storage nodes to a corresponding bit-line;
    drive transistors configured to selectively couple one of the first and second storage nodes to ground;
    load transistors configured to selectively couple the other one of the first and second storage nodes to a power supply; and
    at least one stabilizer transistor configured to provide a corresponding redundant storage node and limit feedback between the first and second storage nodes, the redundant storage node being capable of restoring the first or second storage nodes in case of a soft error.

2. The SRAM cell of claim 1 comprising first and second stabilizer transistors configured to provide corresponding first and second redundant storage nodes.

3. The SRAM cell of claim 1, wherein the load transistors and the drive transistors are arranged in a cross-coupled configuration.

4. The SRAM cell of claim 2 comprising third and fourth stabilizer transistors configured to improve reliability of the first and second redundant storage nodes.

5. The SRAM cell of claim 4, wherein the stabilizer transistors are arranged in a cross-coupled configuration and the load transistors and the drive transistors are effectively cross coupled via the stabilizer transistors.

6. The SRAM cell of claim 1, wherein the load transistors and the drive transistors are in a cross-coupled configuration and:
- a first stabilizer transistor is coupled between the gate of a first one of the load transistors and a gate of a first one of the drive transistors; and
- the first stabilizer transistor is gated by a word line;
- thereby providing a first redundant storage node at the gate of the first one of the drive transistors.

7. The SRAM cell of claim 4, further comprising a second stabilizer transistor coupled between the gate of a second one of the load transistors and a gate of a first one of the drive transistors, the second stabilizer transistor being gated by the word line, thereby providing a second redundant storage node at the gate of the second one of the drive transistors.

8. The SRAM cell of claim 5, further comprising third and fourth stabilizer transistors wherein:
- the third stabilizer transistor is coupled between the gate of the first one of the drive transistors and the power supply; and
- the fourth stabilizer transistor is coupled between the gate of the second one of the drive transistors and the power supply;
- thereby improving reliability of the first and second redundant storage nodes.

* * * * *